(12) United States Patent
Tajic et al.

(10) Patent No.: US 10,778,180 B2
(45) Date of Patent: Sep. 15, 2020

(54) BULK ACOUSTIC WAVE RESONATOR WITH A MODIFIED OUTSIDE STACK PORTION

(71) Applicant: Qorvo US, Inc., Greensboro, NC (US)

(72) Inventors: Alireza Tajic, Winter Springs, FL (US); Paul Stokes, Orlando, FL (US); Ralph Rothemund, Apopka, FL (US); Gernot Fattinger, Sorrento, FL (US)

(73) Assignee: Qorvo US, Inc., Greensboro, NC (US)

( * ) Notice: Subject to any disclaimer, the term of this patent is extended or adjusted under 35 U.S.C. 154(b) by 636 days.

(21) Appl. No.: 15/375,846

(22) Filed: Dec. 12, 2016

(65) Prior Publication Data

US 2017/0170801 A1 Jun. 15, 2017

Related U.S. Application Data

(60) Provisional application No. 62/265,672, filed on Dec. 10, 2015.

(51) Int. Cl.
*H03H 9/02* (2006.01)
*H03H 9/17* (2006.01)
*B06B 1/06* (2006.01)
*H03H 3/02* (2006.01)

(52) U.S. Cl.
CPC ....... *H03H 9/02015* (2013.01); *B06B 1/0644* (2013.01); *B06B 1/0685* (2013.01); *H03H 9/02157* (2013.01); *H03H 9/175* (2013.01); *H03H 2003/025* (2013.01)

(58) Field of Classification Search
CPC .. H03H 9/02; H03H 3/02; H03H 9/17; H03H 9/175; H03H 9/02157; H03H 9/02015
See application file for complete search history.

(56) References Cited

U.S. PATENT DOCUMENTS

| 2005/0269904 A1* | 12/2005 | Oka | H03H 3/02 |
| | | | 310/324 |
| 2006/0226932 A1* | 10/2006 | Fazzio | H03H 9/02149 |
| | | | 333/187 |
| 2008/0084136 A1* | 4/2008 | Schmidhammer | ......... |
| | | | H03H 9/02118 |
| | | | 310/335 |
| 2008/0179995 A1* | 7/2008 | Umeda | H03H 9/02086 |
| | | | 310/324 |

(Continued)

*Primary Examiner* — J. San Martin
(74) *Attorney, Agent, or Firm* — Withrow & Terranova, P.L.L.C.

(57) ABSTRACT

Bulk Acoustic Wave (BAW) resonators that include a modified outside stack portion and methods for fabricating such BAW resonators are provided. One BAW resonator includes a reflector, a bottom electrode, a piezoelectric layer, and a top electrode. An active region is formed where the top electrode overlaps the bottom electrode and an outside region surrounds the active region. The piezoelectric layer includes a top surface adjacent to the top electrode and a bottom surface adjacent to the bottom electrode. The piezoelectric layer further includes an outside piezoelectric portion in the outside region with a bottom surface in the outside region that is an extension of the bottom surface of the piezoelectric layer, and the outside piezoelectric portion includes an angled sidewall that resides in the outside region and extends from the top surface of the piezoelectric layer to the bottom surface of the outside piezoelectric portion in the outside region.

27 Claims, 17 Drawing Sheets

(56) References Cited

U.S. PATENT DOCUMENTS

| | | | |
|---|---|---|---|
| 2008/0211352 A1* | 9/2008 | Barber | H03H 9/175 310/335 |
| 2009/0261922 A1* | 10/2009 | Umeda | H03H 9/02102 333/189 |
| 2010/0013573 A1* | 1/2010 | Umeda | H03H 9/0095 333/186 |
| 2010/0148636 A1* | 6/2010 | Nishihara | H03H 9/02015 310/365 |
| 2011/0037539 A1 | 2/2011 | Jansman et al. | |
| 2012/0218060 A1* | 8/2012 | Burak | H03H 3/04 333/191 |
| 2013/0106248 A1* | 5/2013 | Burak | H03H 9/173 310/360 |
| 2013/0147577 A1* | 6/2013 | Nishihara | H03H 9/706 333/133 |
| 2013/0321101 A1* | 12/2013 | Burgess | H03H 9/175 333/188 |
| 2014/0125198 A1* | 5/2014 | Jacobsen | H01L 27/20 310/314 |
| 2014/0203686 A1* | 7/2014 | Song | H01L 41/314 310/326 |
| 2014/0292150 A1* | 10/2014 | Zou | H03H 9/02102 310/335 |
| 2014/0354115 A1* | 12/2014 | Burak | H03H 9/175 310/348 |

\* cited by examiner

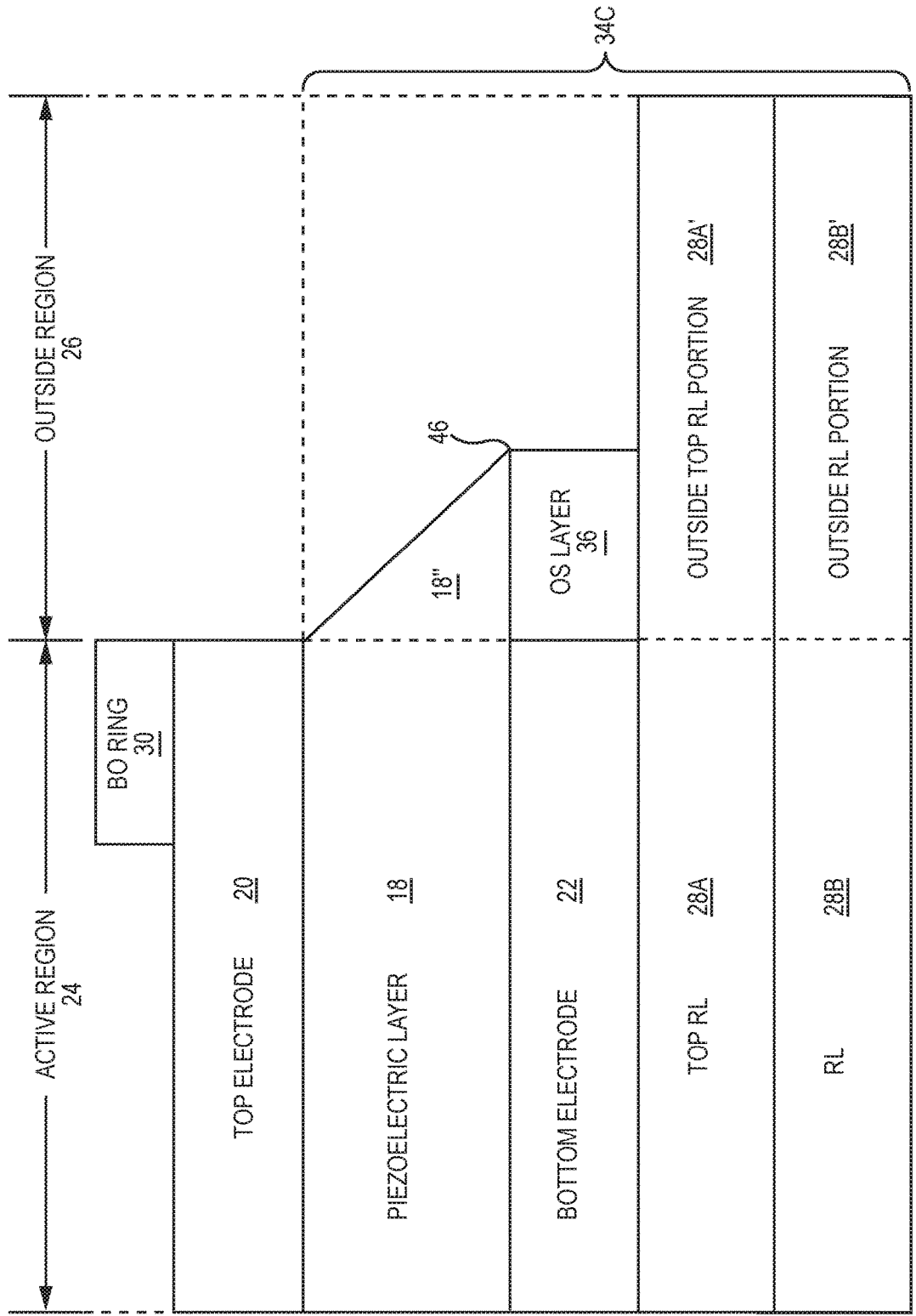

BULK ACOUSTIC WAVE RESONATOR WITH A MODIFIED OUTSIDE STACK PORTION

RELATED APPLICATIONS

This application claims the benefit of provisional patent application Ser. No. 62/265,672, filed Dec. 10, 2015, the disclosure of which is hereby incorporated herein by reference in its entirety.

FIELD OF THE DISCLOSURE

The present invention relates to Bulk Acoustic Wave (BAW) resonators.

BACKGROUND

Acoustic resonators, and particularly Bulk Acoustic Wave (BAW) resonators, are used in many high frequency communication applications. In particular, BAW resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

SUMMARY

Bulk Acoustic Wave (BAW) resonators that include a modified outside stack portion and methods for fabricating such BAW resonators are provided. One BAW resonator comprises a reflector, a bottom electrode over the reflector, a piezoelectric layer over the bottom electrode, and a top electrode over the piezoelectric layer. An active region is formed where the top electrode overlaps the bottom electrode and an outside region surrounds the active region. The piezoelectric layer includes a top surface adjacent to the top electrode and a bottom surface adjacent to the bottom electrode. The piezoelectric layer further comprises an outside piezoelectric portion in the outside region with a bottom surface in the outside region that is an extension of the bottom surface of the piezoelectric layer, and the outside piezoelectric portion includes an angled sidewall that resides in the outside region and extends from the top surface of the piezoelectric layer to the bottom surface of the outside piezoelectric portion in the outside region.

In one embodiment, the bottom electrode comprises an outside bottom electrode (OBE) portion that extends into the outside region, the outside piezoelectric portion is formed on the OBE portion, and the OBE portion extends into the outside region past the outside piezoelectric portion. In various other embodiments, the BAW resonator further comprises an outside (OS) layer in the outside region that is laterally adjacent to the bottom electrode, and the outside piezoelectric portion resides on the OS layer in the outside region.

The OS layer, in one embodiment, extends into the outside region past the outside piezoelectric portion. In another embodiment, the OS layer and the outside piezoelectric portion extend the same lateral distance into the outside region. In other embodiments, the top layer of the reflector comprises a top reflector layer (RL) portion that resides in the outside region, the OS layer resides on the outside top RL portion, and the outside top RL portion, the OS layer, and the outside piezoelectric portion extend the same lateral distance into the outside region.

One method comprises providing a reflector, forming a bottom electrode over the reflector, forming a piezoelectric layer over the bottom electrode, and forming a top electrode over the piezoelectric layer. An active region is formed where the top electrode and the bottom electrode overlap and an outside region surrounds the active region. The piezoelectric layer comprises a top surface adjacent to the top electrode and a bottom surface adjacent to the bottom electrode, an outside piezoelectric portion of the piezoelectric layer with a bottom surface that is an extension of the bottom surface of the piezoelectric layer is provided in the outside region, and a portion of the outside piezoelectric portion is removed such that an angled sidewall that extends from the top surface of the piezoelectric layer to the bottom surface of the outside piezoelectric portion is provided in the outside region.

In one embodiment, an OBE portion that is an extension of the bottom electrode is provided in the outside region, the outside piezoelectric portion is provided on the OBE portion, and the portion of the outside piezoelectric portion is removed such that the OBE portion extends into the outside region past the outside piezoelectric portion. The method, in various other embodiments, comprises forming an OS layer that is laterally adjacent to the bottom electrode in the outside region.

In one embodiment, the portion of the outside piezoelectric portion is removed such that the OS layer extends into the outside region past the outside piezoelectric portion. In another embodiment, the portion of the outside piezoelectric portion is removed such that the OS layer extends the same lateral distance into the outside region as the outside piezoelectric portion. In yet another embodiment, a RL portion that resides in the outside region under the OS layer is provided and a portion of the outside top RL portion is removed, such that the outside top RL portion extends the same lateral distance into the outside region as the OS layer and the outside piezoelectric portion.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated herein and forming a portion of this specification illustrate several aspects of the disclosure, and together with the description serve to explain the principles of the disclosure.

FIGS. 6A-6F are diagrams illustrating various embodiments of a method for fabricating a BAW resonator consistent with the embodiments discussed with reference to FIGS. 5A-5D;

Figure 1:
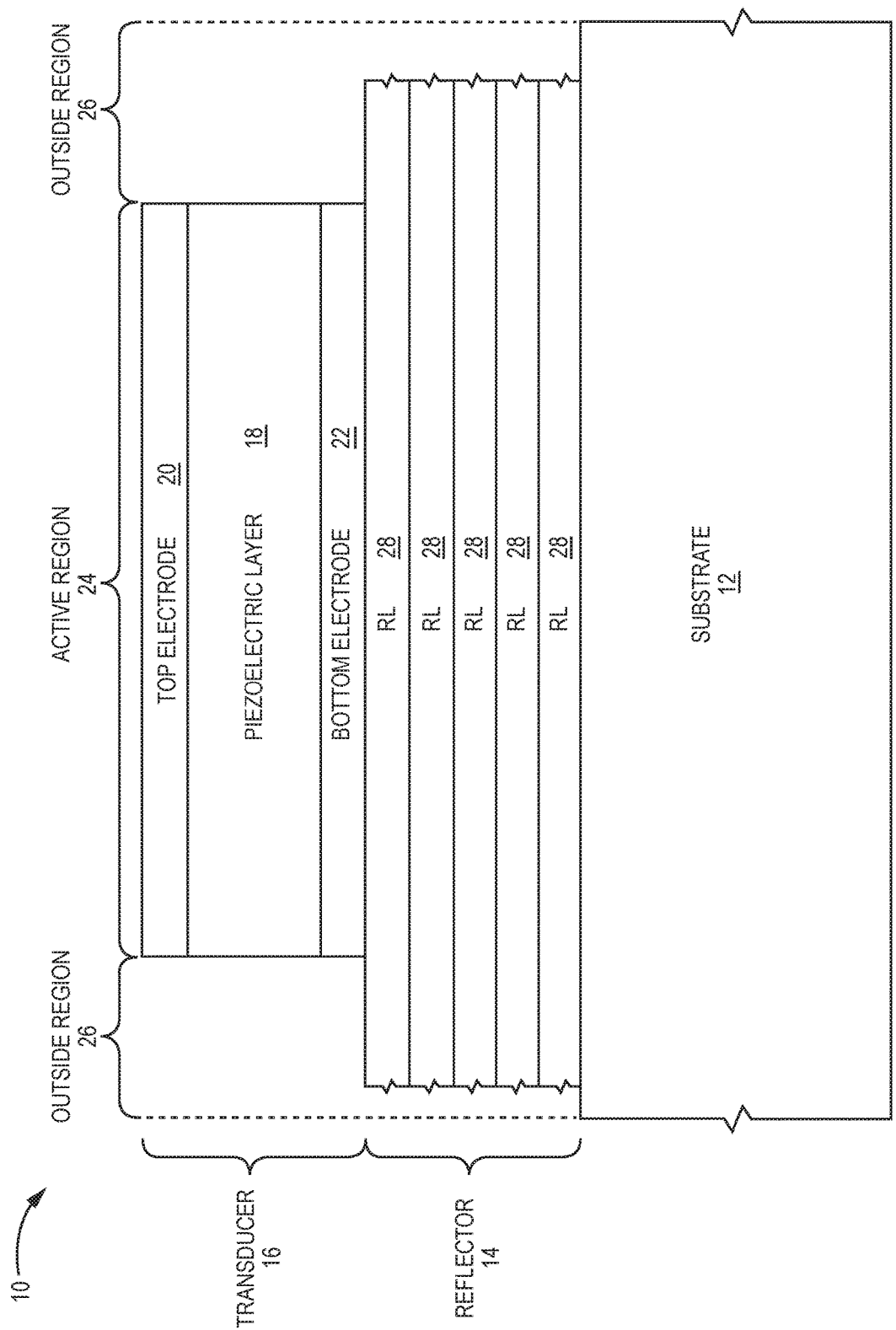
FIG. 1 is a diagram illustrating a conventional Bulk Acoustic Wave (BAW) resonator including an active region and an outside region.
Figure 7A:
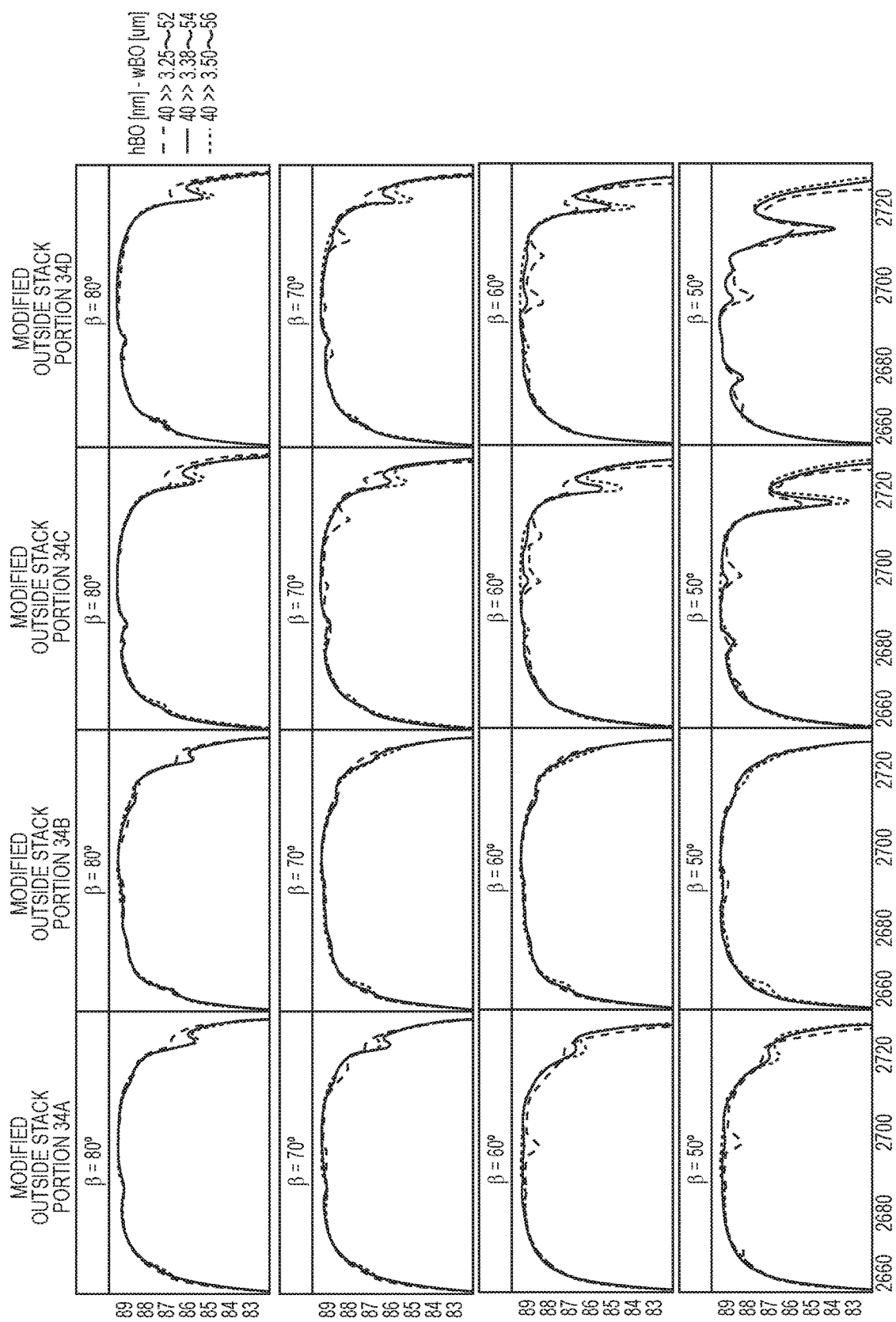
Figure 7B:
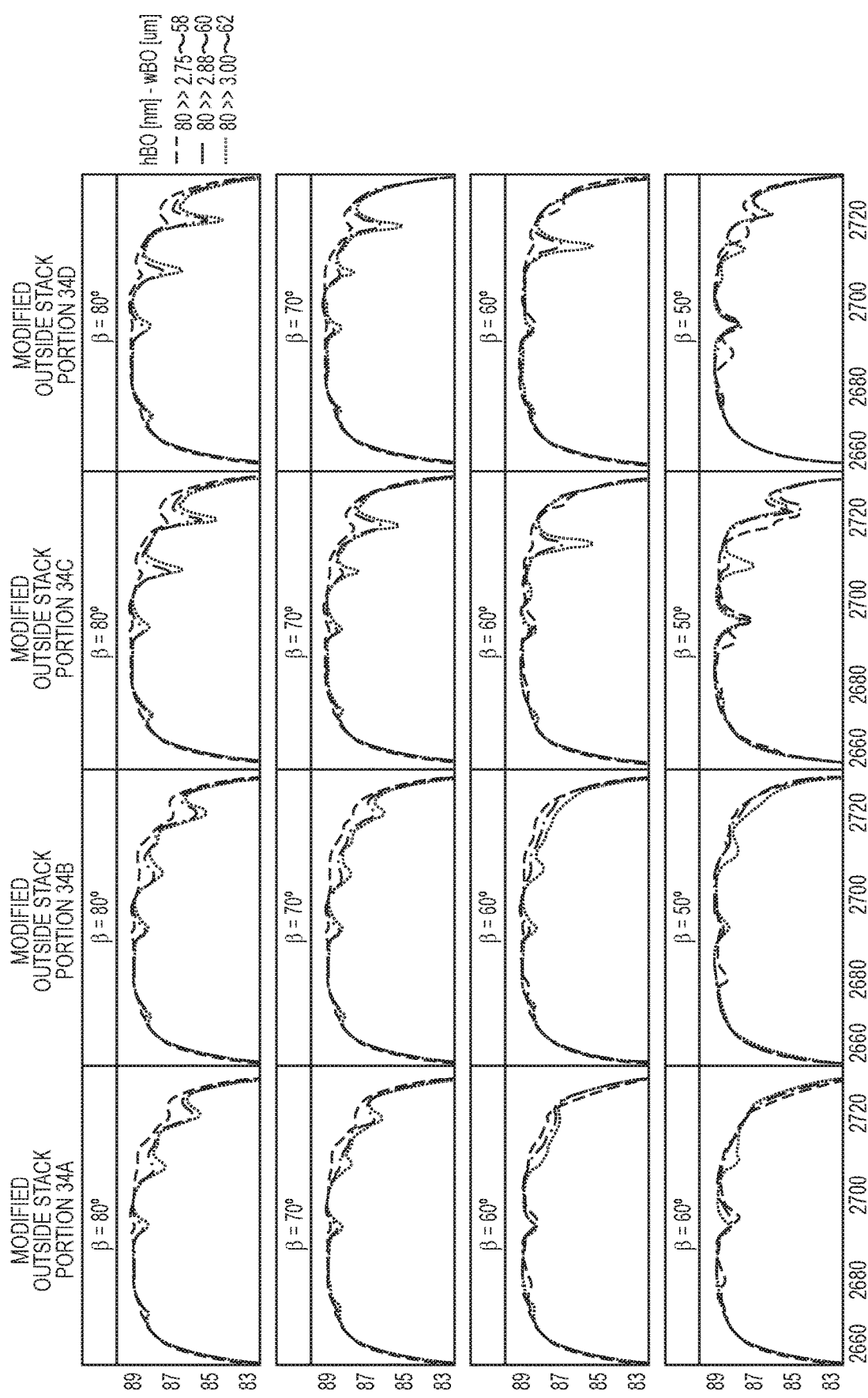
Figure 8:
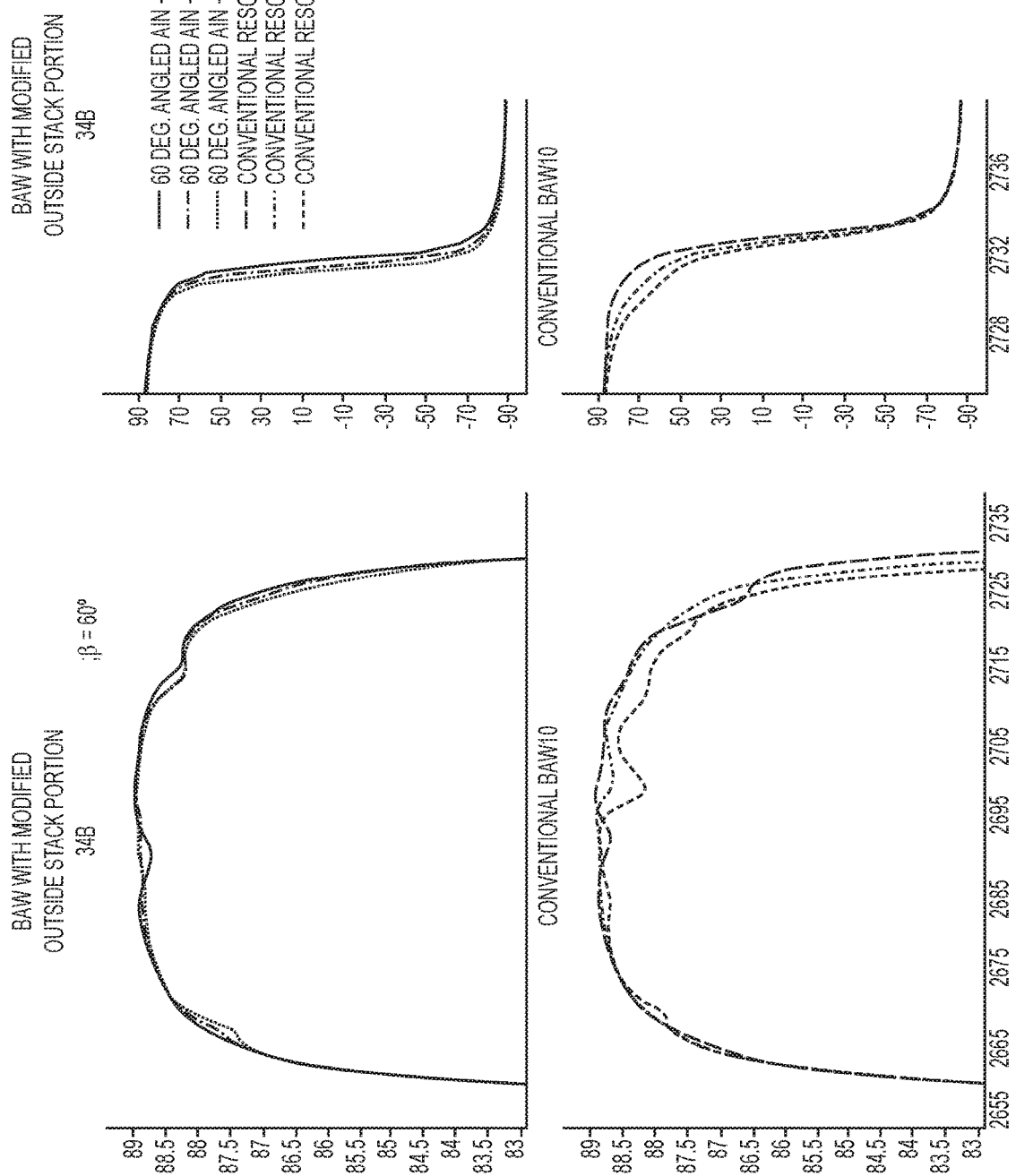

FIGS. 7A and 7B are diagrams illustrating the response representing the various degrees to which the spurious mode is suppressed by a BAW resonator with the various embodiments of the modified stack portions discussed with reference to FIGS. 5A-5D; and FIG. 8 is a diagram illustrating a comparison of the degree to which the spurious mode is suppressed by a BAW resonator with the embodiment of the modified outside stack discussed with reference to FIG. 5B and the conventional BAW resonator discussed with reference to FIG. 1.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this Specification and the relevant art and will not be interpreted in an idealized or overly formal sense unless expressly so defined herein.

Bulk Acoustic Wave (BAW) resonators that include a structure for confining lateral energy and methods for fabricating such BAW resonators are provided. One BAW resonator includes a reflector, a bottom electrode over a first portion of the reflector, a piezoelectric layer over the bottom electrode, and a top electrode over a first portion of the piezoelectric layer. An active region is formed where the top electrode overlaps the bottom electrode, an outside region surrounds the active region, and the piezoelectric layer includes a second portion with an angled sidewall in the outside region. The piezoelectric layer includes a top surface adjacent to the top electrode and a bottom surface adjacent to the bottom electrode. The bottom surface is wider than the top surface, the angled sidewall extends from the top surface to the bottom surface, and the angled sidewall forms an acute angle with respect to the bottom surface.

BAW resonators are used in many high-frequency filter applications. An exemplary BAW resonator 10 is illustrated in FIG. 1. The BAW resonator 10 is a solidly mounted resonator (SMR) type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Platinum (Pt), or like material, and the piezoelectric layer 18 may be formed of Aluminum Nitride (AlN), Zinc Oxide (ZnO) or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these verticallypropagating acoustic waves in the transducer 16. Acoustic waves traveling upwardly are reflected back into the transducer 16 by the air-metal boundary at the top surface of the top electrode 20. Acoustic waves traveling downwardly are reflected back into the transducer 16 by the reflector 14, or by an air cavity, which is provided just below the transducer in a Film BAW Resonator (FBAR).

The reflector 14 is typically formed by a stack of reflector layers (RL) 28A through 28E, which alternate in material composition to produce a significant reflection coefficient at the junction of adjacent reflector layers 28. Typically, the reflector layers 28A through 28E alternate between materials having high and low acoustic impedances, such as tungsten (W) and silicon dioxide (SiO2). While only five reflector layers 28A through 28E are illustrated in FIG. 1, the number of reflector layers 28 and the structure of the reflector 14 will vary from one design to another.

Figure 2:
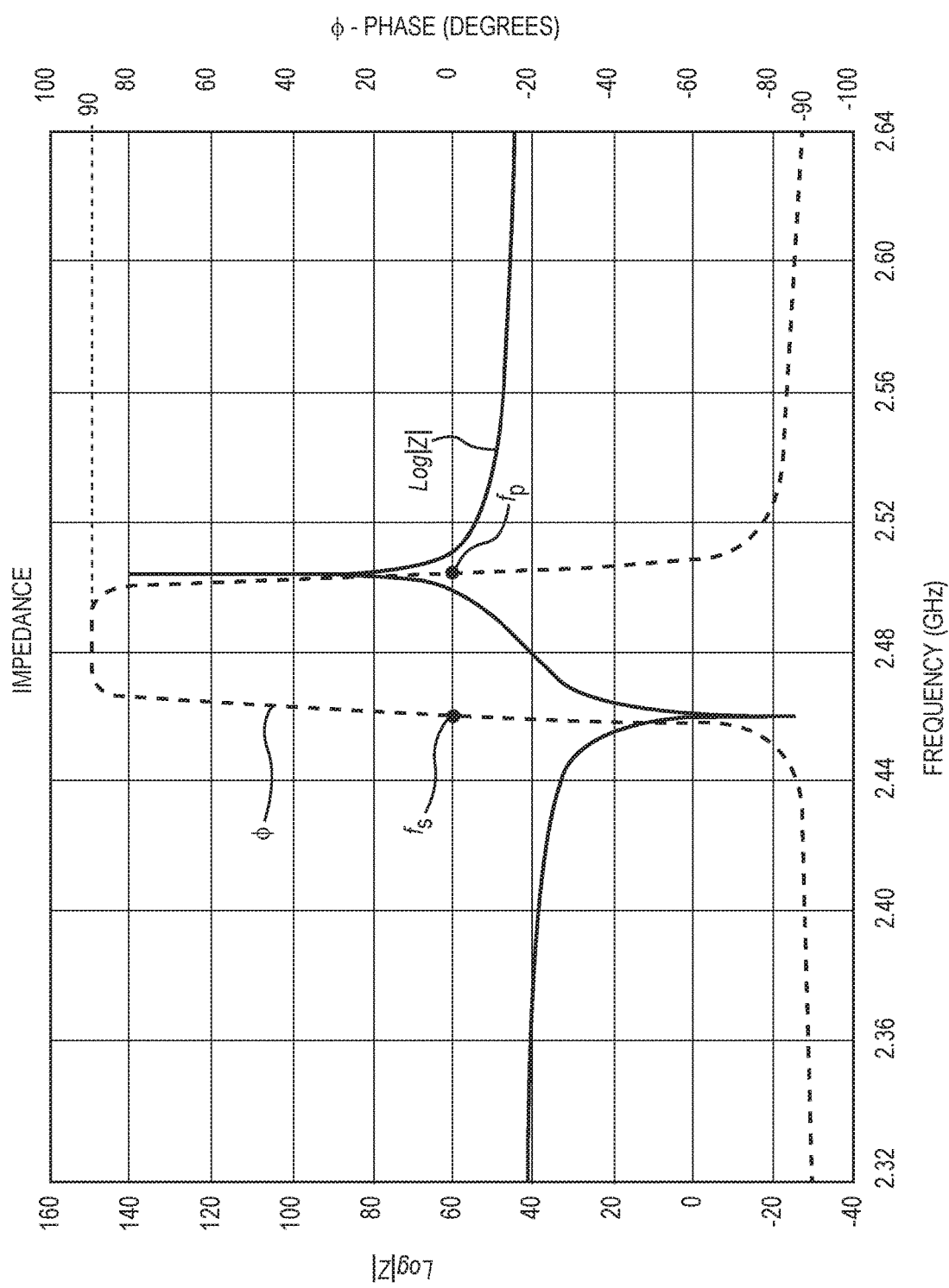
FIG. 2 is a diagram graphically illustrating the magnitude and phase of the electrical impedance as a function of the frequency for a relatively ideal BAW resonator.

The magnitude (Z) and phase ($\phi$) of the electrical impedance as a function of the frequency for a relatively ideal BAW resonator 10 is provided in FIG. 2. The magnitude (Z) of the electrical impedance is illustrated by the solid line, while the phase ($\phi$) of the electrical impedance is illustrated by the dashed line. A unique feature of the BAW resonator 10 is that it has both a resonance frequency and an anti-resonance frequency. The resonance frequency is typically referred to as the series resonance frequency (fs), and the anti-resonance frequency is typically referred to as the parallel resonance frequency (fp). The series resonance frequency (fs) occurs when the magnitude of the impedance, or reactance, of the BAW resonator 10 approaches zero. The parallel resonance frequency (fp) occurs when the magnitude of the impedance, or reactance, of the BAW resonator 10 peaks at a significantly high level. In general, the series resonance frequency (fs) is a function of the thickness of the piezoelectric layer 18 and the mass of the bottom and top electrodes 20 and 22.

For the phase, the BAW resonator 10 acts like an inductance that provides a 90° phase shift between the series resonance frequency (fs) and the parallel resonance frequency (fp). In contrast, the BAW resonator 10 acts like a capacitance that provides a −90° phase shift below the series resonance frequency (fs) and above the parallel resonance frequency (fp). The BAW resonator 10 presents a very low, near zero, resistance at the series resonance frequency (fs), and a very high resistance at the parallel resonance frequency (fp). The electrical nature of the BAW resonator 10 lends itself to the realization of a very high Q (quality factor) inductance over a relatively short range of frequencies, which has proven to be very beneficial in high frequency filter networks, especially those operating at frequencies around 1.8 GHz and above.

Figures 3A, 3B, 3C:
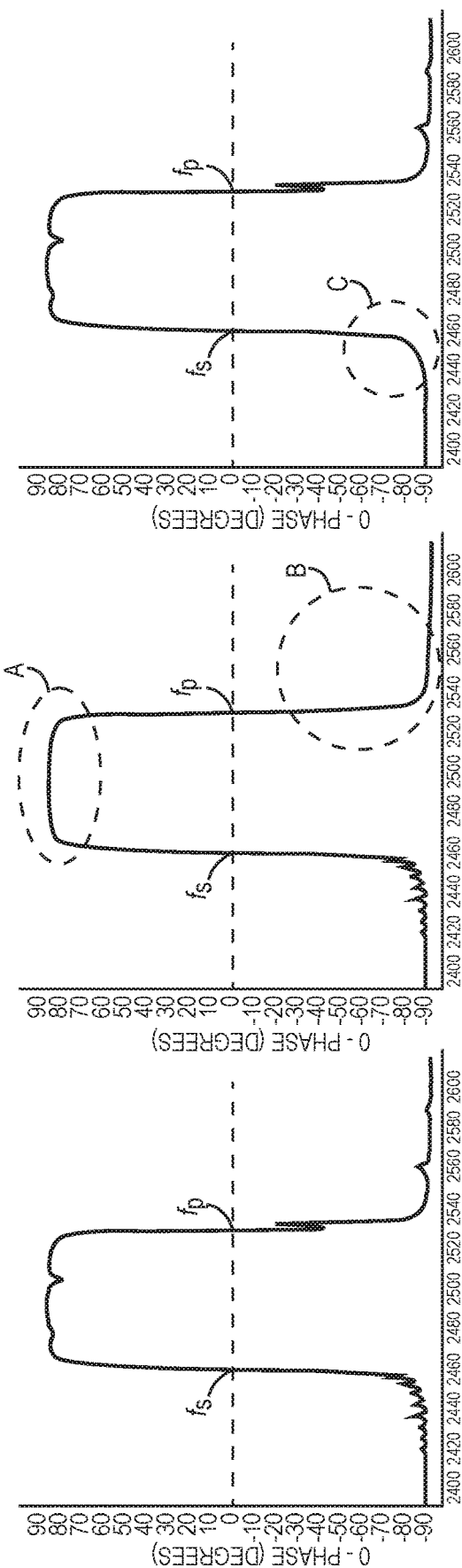
FIGS. 3A-3C are diagrams graphically illustrating the phase curves for various conventional BAW resonators.

Unfortunately, the phase ($\phi$) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency (fs), between the series resonance frequency (fs) and the parallel resonance frequency (fp), and above the parallel resonance frequency (fp). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

Figure 4:
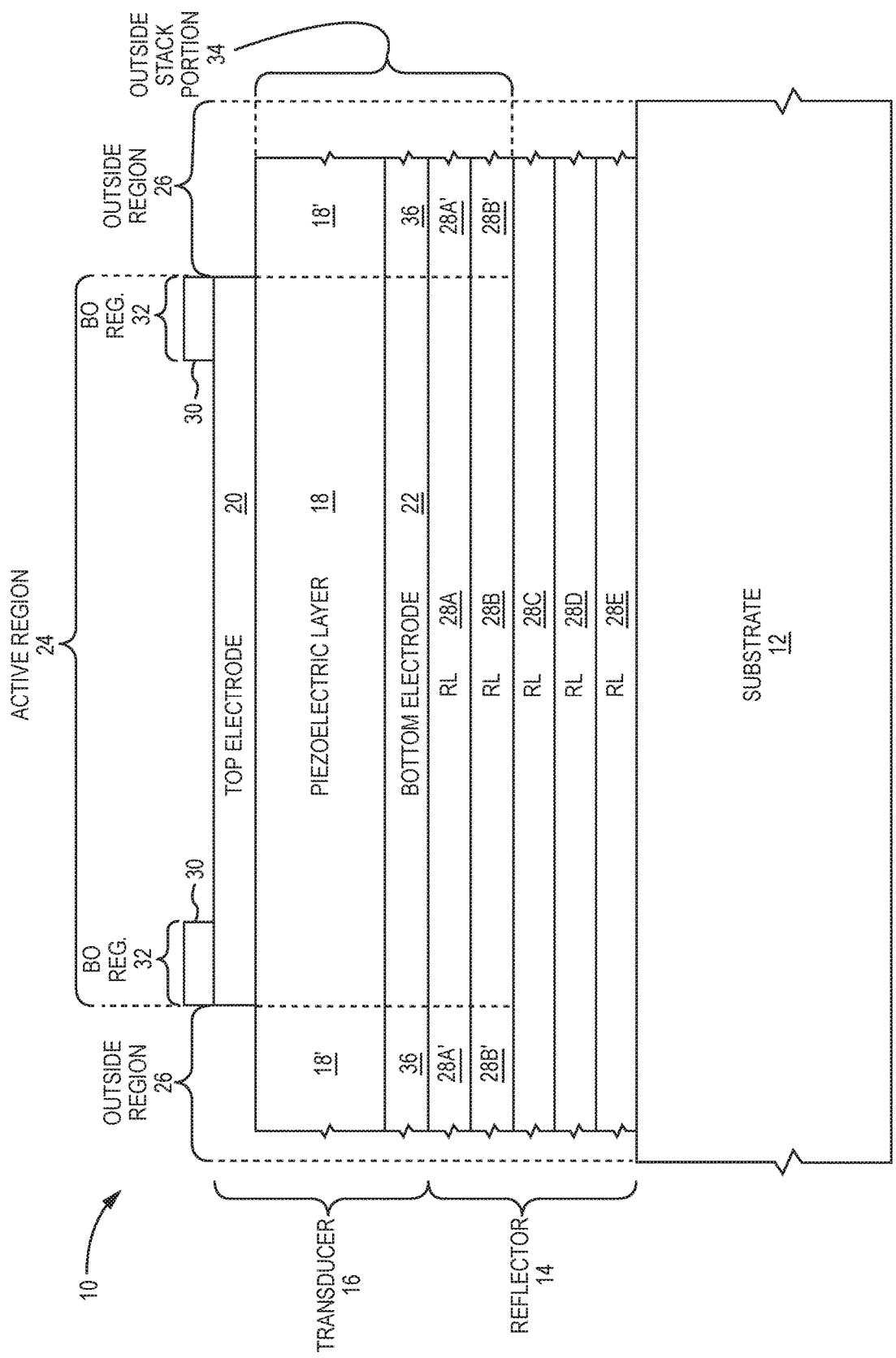
FIG. 4 is a diagram illustrating a conventional BAW resonator including an outside stack portion in the outside region.

As illustrated in FIG. 4, a border (BO) ring 30 is formed on or within the top electrode 20 to suppress certain of the spurious modes. The spurious modes that are suppressed by the BO ring 30 are those above the series resonance frequency (fs), as highlighted by circles A and B in the phase curve of FIG. 3B. Circle A shows a suppression of the ripple, and thus the spurious mode, in the passband of the phase curve, which resides between the series resonance frequency (fs) and the parallel resonance frequency (fp). Circle B shows suppression of the ripple, and thus the spurious modes, above the parallel resonance frequency (fp). Notably, the spurious mode in the upper shoulder of the passband, which is just below the parallel resonance frequency fp, and the spurious modes above the passband are suppressed, as evidenced by the smooth or substantially ripple free phase curve between the series resonance frequency (fs) and the parallel resonance frequency (fp) and above the parallel resonance frequency (fp).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency (fs), the BO ring 30 has little or no impact on those spurious modes below the series resonance frequency (fs), as shown in FIG. 3B. A technique referred to as apodization is often used to suppress the spurious modes that fall below the series resonance frequency (fs).

Apodization works to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency (fs) are suppressed. Assuming no BO ring 30 is provided, one can readily see in FIG. 3C that apodization fails to suppress those spurious modes above the series resonant frequency (fs). As such, the typical BAW resonator 10 employs both apodization and the BO ring 30.

As further illustrated in the embodiment of FIG. 4, the BAW resonator 10 comprises an outside stack portion 34 that resides in the outside region 26. At least in the illustrated embodiment, the outside stack portion 34 comprises an outside RL portion 28B' that is an extension of the RL 28B, an outside top RL portion 28A' that is an extension of the top RL 28A, and an outside (OS) layer 36. The OS layer 36 resides adjacent to and on the same lateral (horizontal) level as the bottom electrode 22. Furthermore, the OS layer 36 is comprised of the same material as the top RL 28A and the outside top RL portion 28A', and is formed over the outside top RL portion 28A'. The outside stack portion 34 further comprises an outside piezoelectric portion 18' that is an extension of the piezoelectric layer 18 residing over the OS layer 36.

Figure 5A:
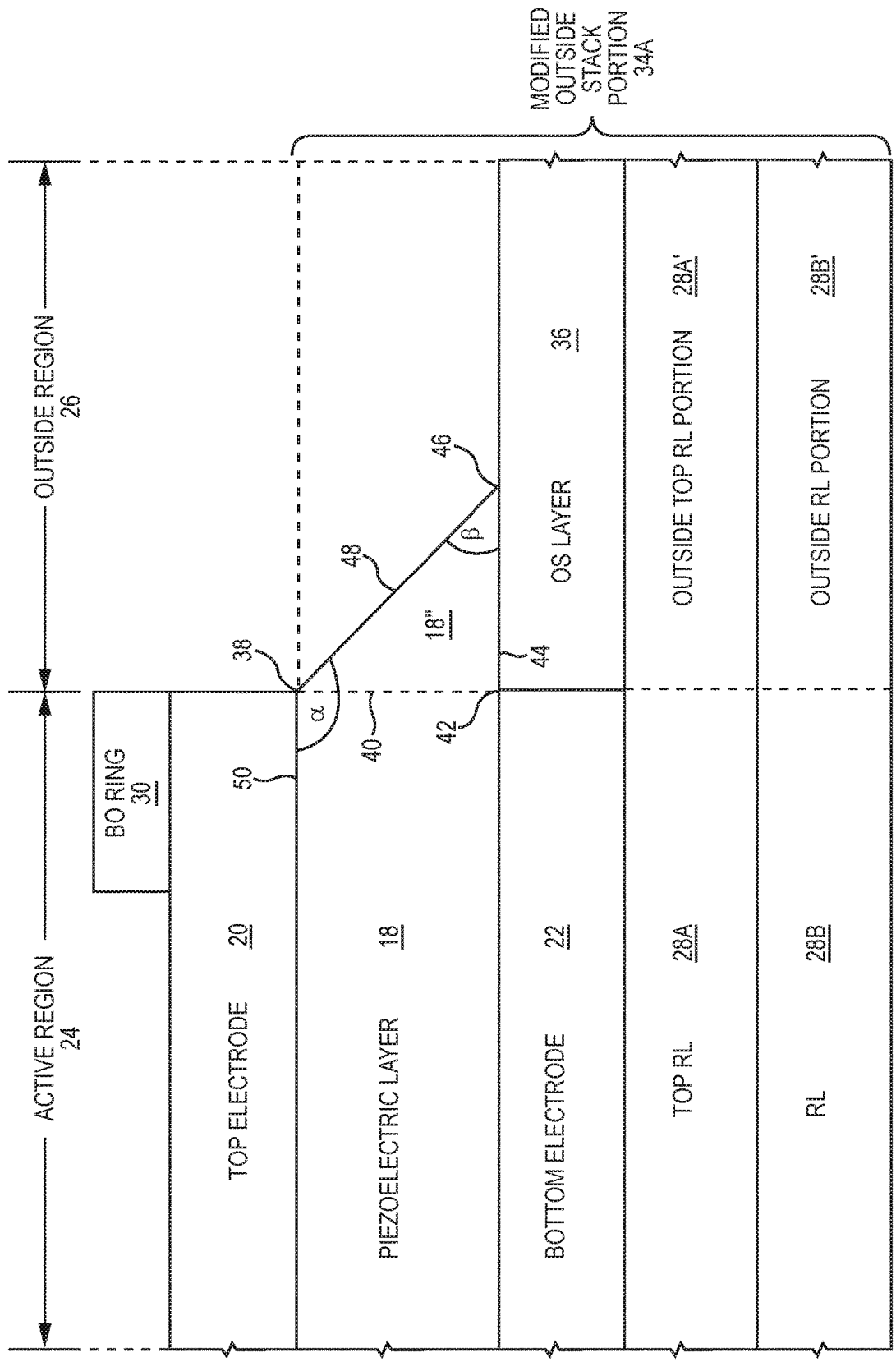
FIGS. 5A-5D are diagrams illustrating various embodiments of a modified outside stack portion in the outside region of a BAW resonator.

A supplement to or alternative for apodization and the BO ring 30 is described below in which energy confinement in the active region 24 of the BAW resonator 10 can be improved by modifying the outside stack portion 34 in the outside region 26. With reference to FIG. 5A, a modified outside stack portion 34A in the outside region 26 is shown. The outside stack portion 34A comprises a modified outside piezoelectric portion 18" that is essentially a triangular portion of the piezoelectric layer 18 that extends into the outside region 26.

The outside piezoelectric portion 18" is a generalized right triangle and has three sides: a vertical side 40, a horizontal side 44, and an angled sidewall 48. The triangular characterization of the outside piezoelectric portion 18" need not be perfectly triangular. The vertical side 40 is imaginary and resides on the boundary between the active region 24 and the outside region 26, and extends vertically between a transition point 38 on the upper surface of the piezoelectric layer 18 and a vertex 42 on the bottom surface of the piezoelectric layer 18. The horizontal side 44 extends laterally from the vertex 42 to an outside point 46. The angled sidewall 48 extends between the transition point 38 to the outside point 46.

The angled sidewall 48 forms an acute angle (β) with respect to the horizontal side 44 of the outside piezoelectric portion 18". Stated differently, the angled sidewall 48 forms an obtuse angle (α) with respect to a top surface 50 of the piezoelectric layer 18.

In some embodiments, the acute angle (β) is in the range of about 45 degrees to about 80 degrees and, correspondingly, the obtuse angle (α) is in the range of about 100 degrees to about 135 degrees. In other embodiments, the acute angle (β) is in the range of about 60 degrees to about 70 degrees and, correspondingly, the obtuse angle (α) is in the range of about 110 degrees to about 120 degrees. In one embodiment, the acute angle (β) is 60 degrees and, correspondingly, the obtuse angle (α) is 120 degrees.

The outside piezoelectric portion 18" is formed over the OS layer 36, which resides in the outside region 26 on the same lateral or horizontal level as the bottom electrode 22. The OS layer 36 is formed on the outside top RL portion 28A', which is formed on the outside RL portion 28B'.

Figure 5B:
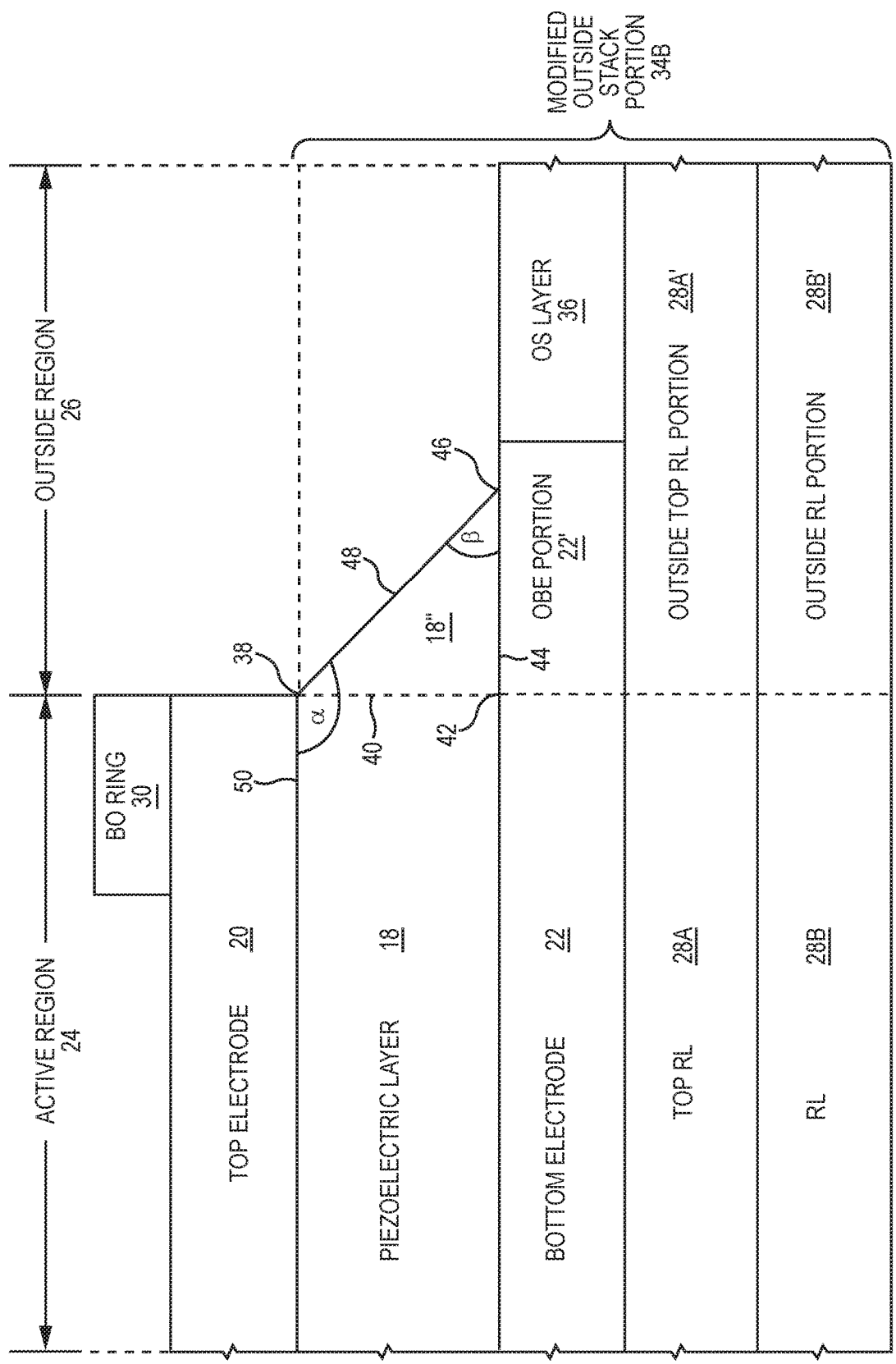

With reference to FIG. 5B, a modified outside stack portion 32B in the outside region 26 is shown. The modified stack portion 32B comprises an outside bottom electrode (OBE) portion 22', which is an extension of the bottom electrode 22 that extends into the outside region 26. The outside stack portion 32B further comprises a modified outside piezoelectric portion 18" that is a portion of the piezoelectric layer 18 that extends into the outside region 26 similar to the modified outside piezoelectric portion 18" discussed above with reference to FIG. 5A.

The modified outside piezoelectric portion 18" comprises a transition point 38, a horizontal side 44, a vertex 42, and an angled sidewall 48 similar to the modified outside stack portion 34A discussed above with reference to FIG. 5A. However, the horizontal side 44 of the modified outside piezoelectric portion 18" in the modified outside stack portion 32B resides on the OBE portion 22' and the OBE portion 22' extends laterally to at least the outside point 46, and as illustrated in FIG. 5B, past the modified outside piezoelectric portion 18". In the embodiment of FIG. 5B, the horizontal side 44 of the modified outside piezoelectric portion 18" is formed over the OBE portion 22', instead of being formed over the OS layer 36 as in the embodiment of FIG. 5A.

The OS layer 36 in the modified outside stack portion 34B resides in the outside region 26. The OS layer 36 is on the same lateral or horizontal level as the bottom electrode 22 and the OBE portion 22'. As illustrated in FIG. 5B, the modified outside piezoelectric portion 18" in the modified outside stack portion 34B does not reside on the OS layer 36.

Figure 5C:
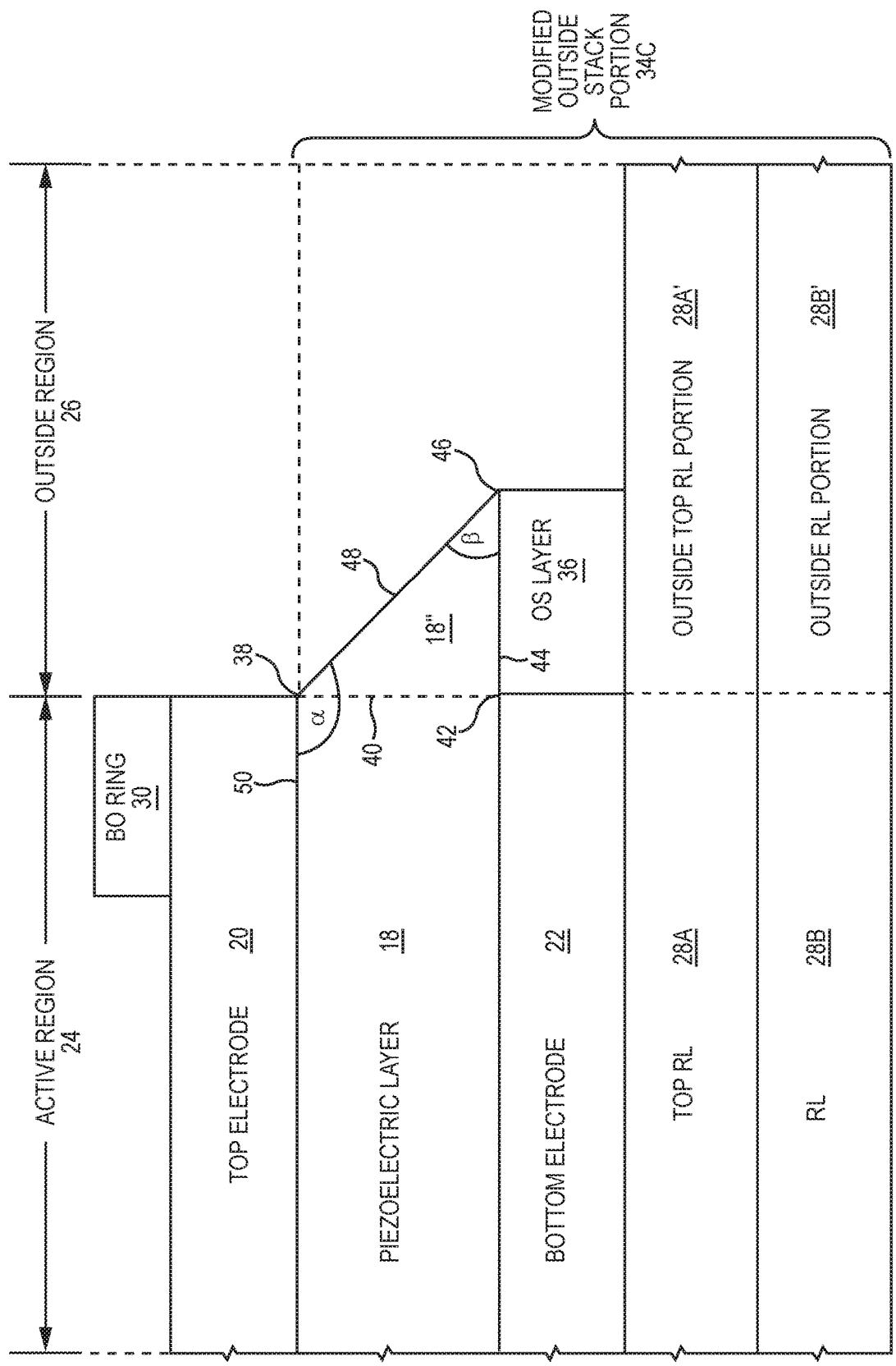

Referring to FIG. 5C, a modified outside stack portion 34C in the outside region 26 is shown. The modified outside stack portion 34C comprises a modified outside piezoelectric portion 18" over an OS layer 36 similar to the modified outside piezoelectric portion 18" over the OS layer 36 in the modified outside stack portion 34A discussed above with reference to FIG. 5A. In the embodiment illustrated in FIG. 5C, the modified outside piezoelectric portion 18" and the OS layer 36 extend about the same lateral distance into the outside region 26. In other words, the modified outside piezoelectric portion 18" and the OS layer 36 both end at a vertical plane that coincides with the outside point 46 of the modified outside piezoelectric portion 18".

Figure 5D:
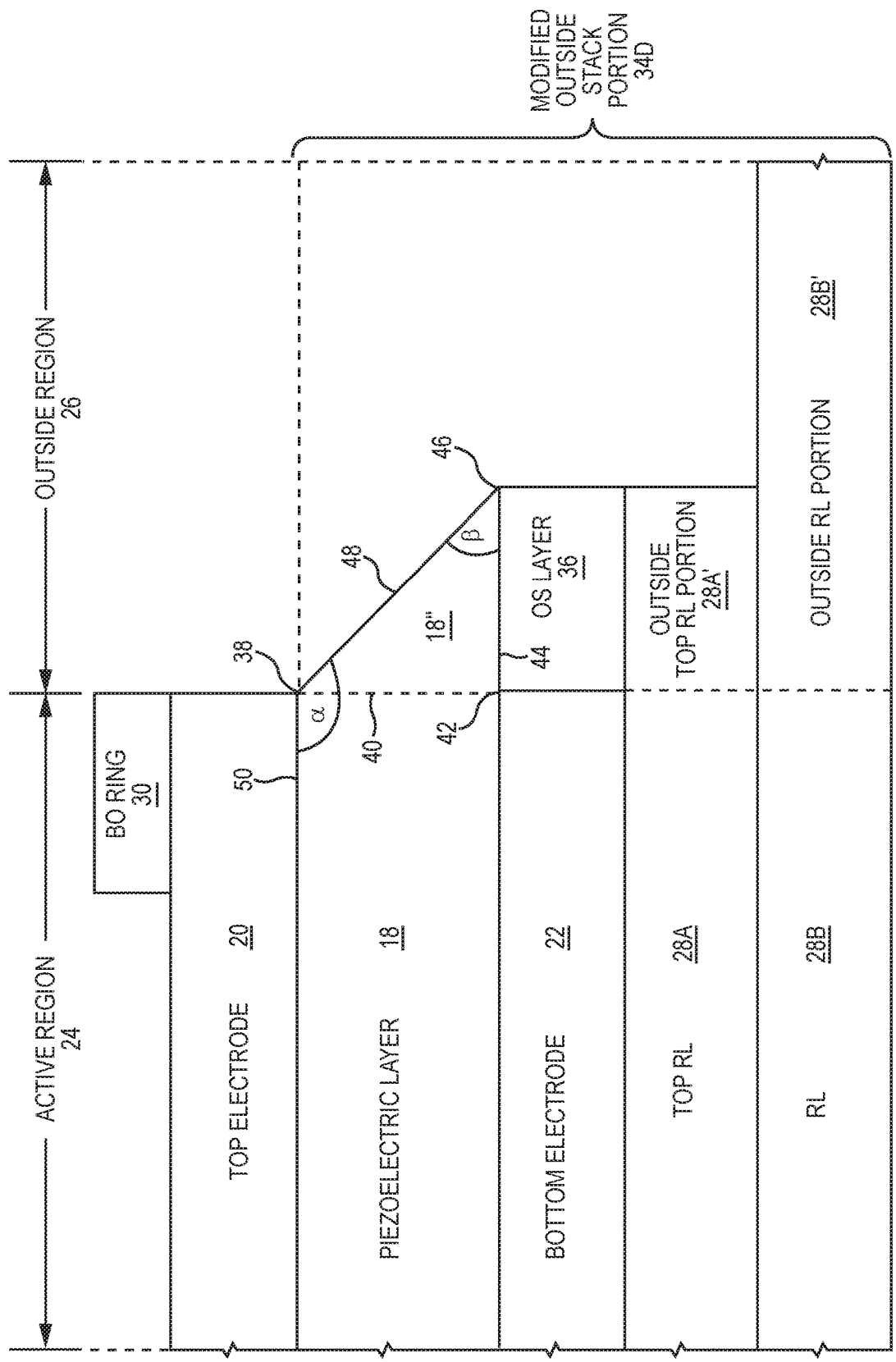

Referring to FIG. 5D, a modified outside stack portion 34D in the outside region 26 is shown. The modified outside stack portion 34D comprises a modified outside piezoelectric portion 18" over an OS layer 36 similar to the modified outside stack portion 34C discussed above with reference to FIG. 5C. In the embodiment illustrated in FIG. 5D, the outside top RL portion 28A' extends the same lateral distance into the outside region 26 as the modified outside piezoelectric portion 18" and the OS layer 36. In other words, the modified outside piezoelectric portion 18", the OS layer 36, and the outside top RL portion 28A' each end at the vertical plane that coincides with the outside point 46 of the modified outside piezoelectric portion 18".

The modified outside stack portions 34A through 34D enable a BAW resonator, such as BAW resonator 10, to operate more efficiently and effectively. Specifically, removing materials from an upper portion of an outside stack in the outside region 26 to form the modified outside stack portions 34A through 34D improves lateral energy confinement in the active region 24, and thus provides a BAW resonator with a higher Q value.

FIGS. 6A-6F are diagrams illustrating various embodiments of a method for fabricating a BAW resonator, such as BAW resonator 10, with the modified outside stack portions 34A-34D discussed with reference to FIGS. 5A-5D.

Figure 6A:
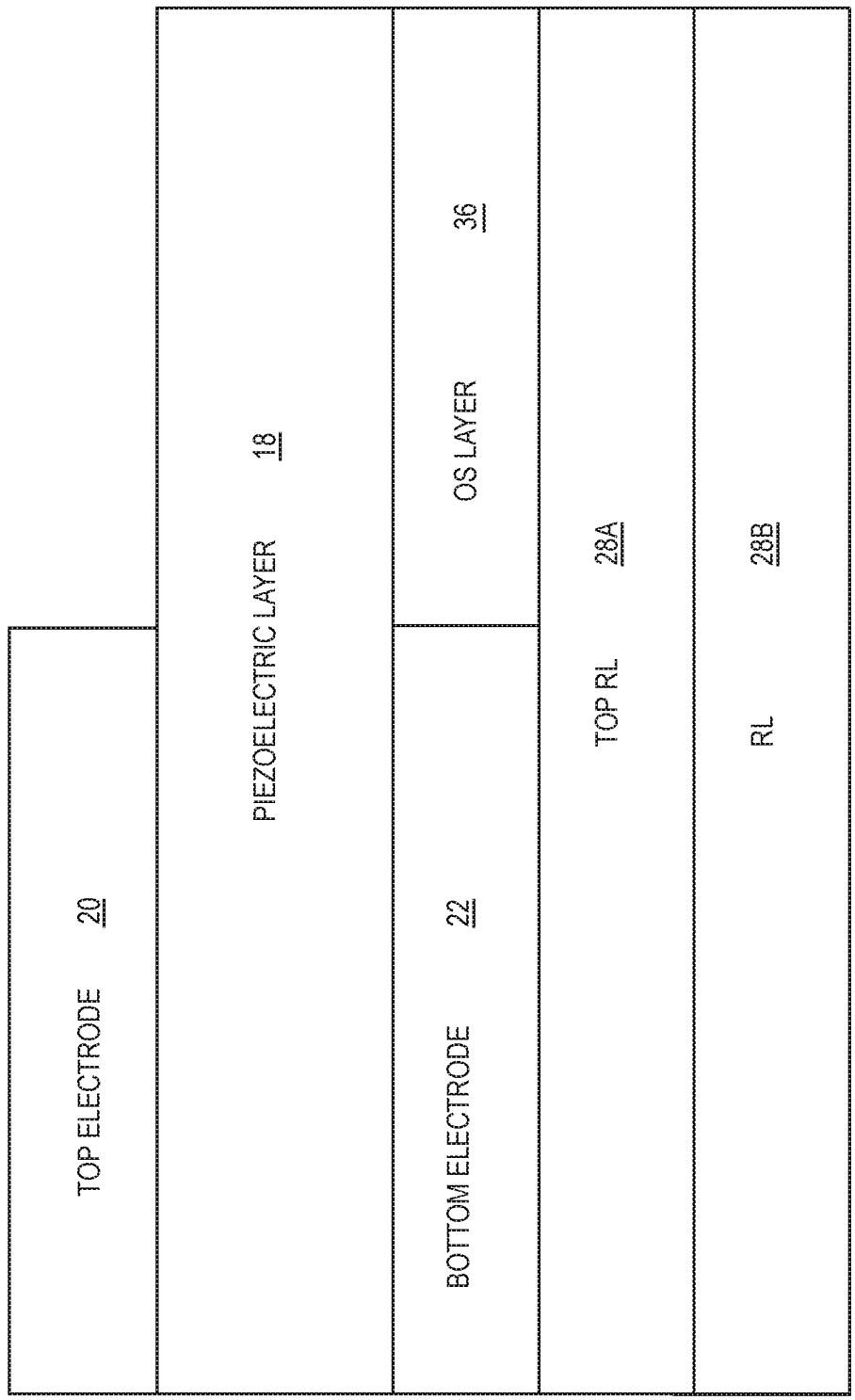

Referring to FIG. 6A, the method comprises depositing a reflector layer (RL) 28B over another RL layer 28C, which is not shown in FIG. 6A, but is shown in FIG. 4. A top RL 28A is deposited over the RL 28B. A bottom electrode 22 and an OS layer 36 are formed over different portions of the top RL 28A and on the same lateral or horizontal level as one another. A piezoelectric layer 18 is deposited over the bottom electrode 22 and the OS layer 36. A top electrode 20 is formed over a portion of the piezoelectric layer 18.

The RL 28B, the top RL 28A, the bottom electrode 22, the OS layer 36, the piezoelectric layer 18, and the top electrode 20 may be deposited using any deposition technique known in the art or developed in the future. Examples of deposition techniques include, but are not limited to, ion beam deposition (IBD), chemical vapor deposition (CVD), physical vapor deposition (PVD), molecular beam epitaxy (MBE), electrochemical deposition (ECD), and/or like deposition techniques.

Figure 6B:
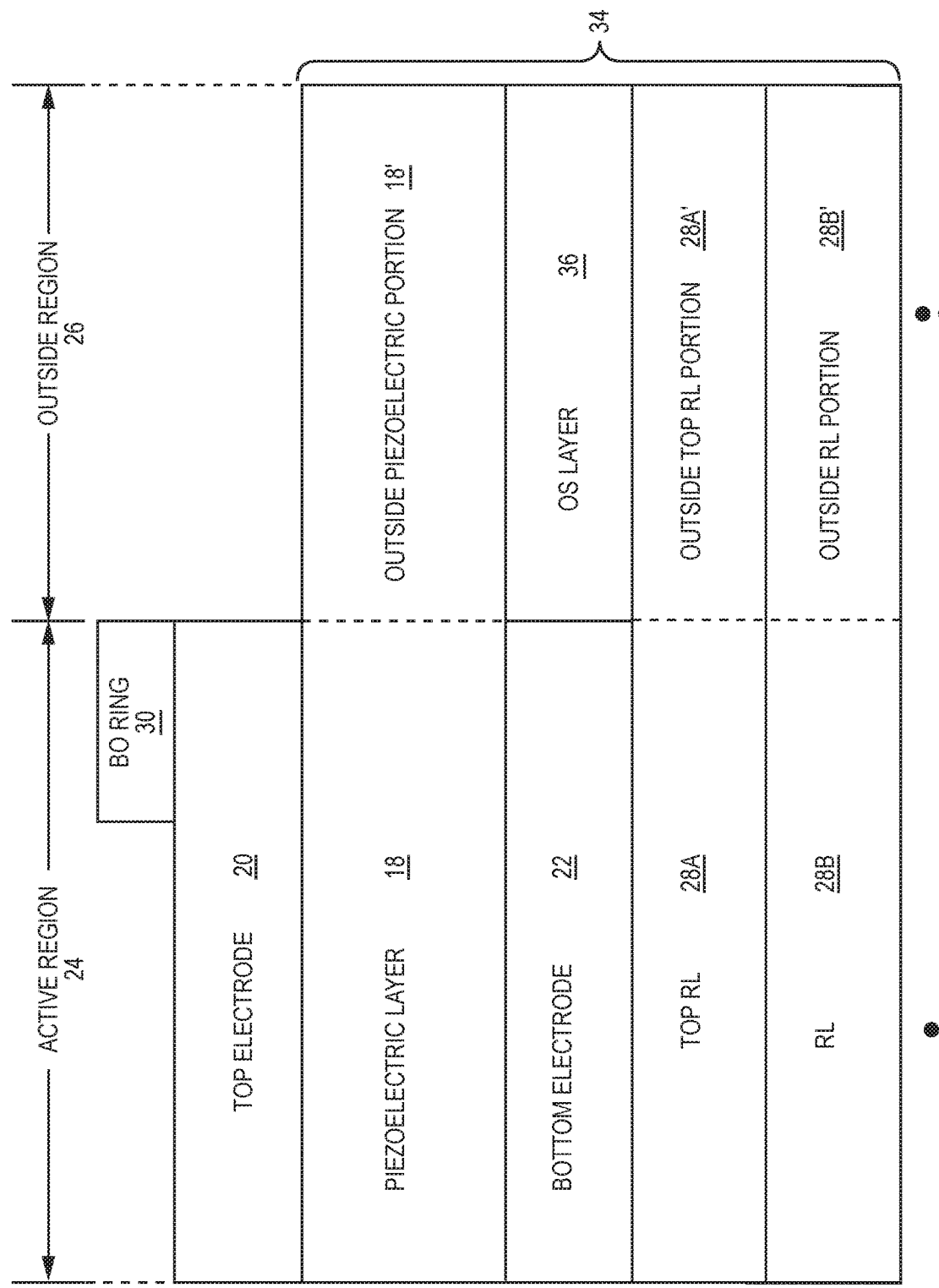

As illustrated in FIG. 6B, a BO ring 30 is formed over a portion of the top electrode 20 to define a border between an active region 24 and an outside region 26. The BO ring 30 may be deposited using any of the deposition techniques discussed above with reference to FIG. 6A.

The active region 24 comprises the BO ring 30, the top electrode 20, the piezoelectric layer 18, the bottom electrode 22, the top RL 28A, and the RL 28B. The outside region 26 comprises an outside piezoelectric portion 18', the OS layer 36, an outside top RL portion 28A', and an outside RL portion 28B', which define an outside stack portion 34.

Figure 6C:
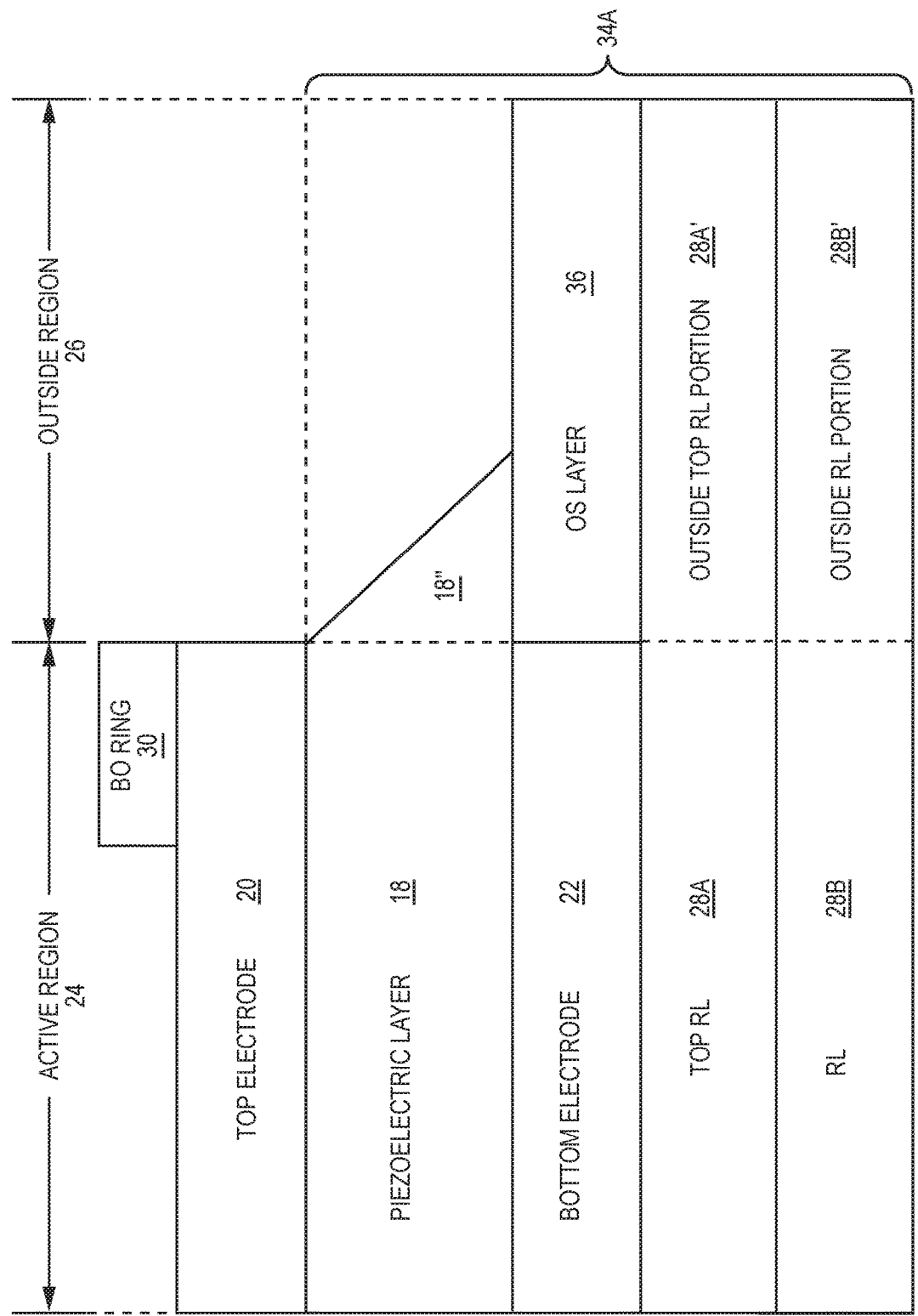

With reference to FIG. 6C, a portion of the outside piezoelectric portion 18' is removed to create a modified outside piezoelectric portion 18", as discussed above with reference to FIGS. 5A-5D. That is, FIG. 6C illustrates the formation of the modified outside stack portion 34A as discussed above with reference to FIG. 5A.

The portion of the outside piezoelectric portion 18' may be removed to create the modified outside piezoelectric portion 18" using any removal or trimming technique known in the art or developed in the future. Examples of removal or trimming techniques include, but are not limited to, physical dry etching, wet etching, reactive ion etching and/or like trimming techniques.

Figure 6D:
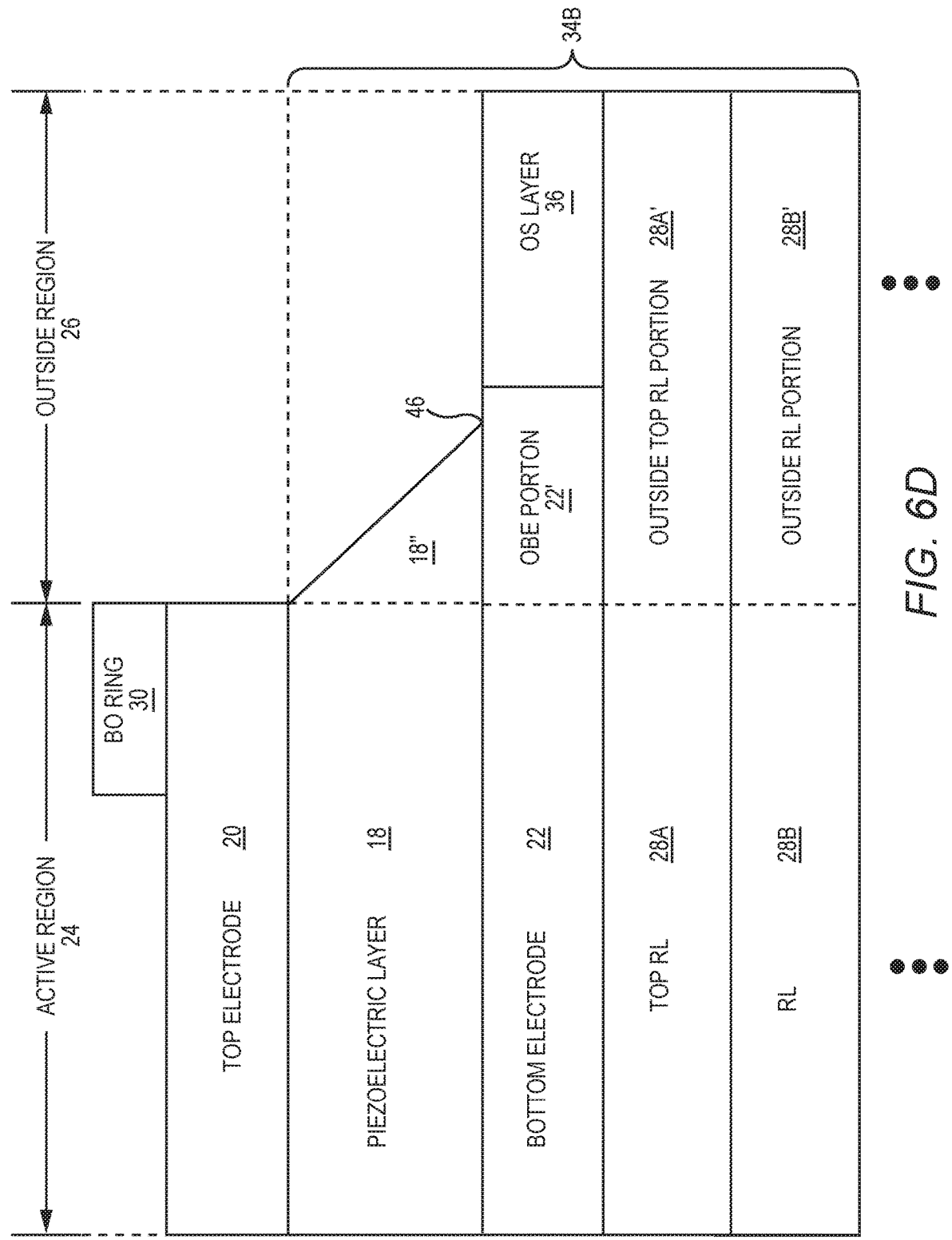

Referring to FIG. 6D, when the bottom electrode 22 is deposited on the top RL 28A, the bottom electrode 22 includes an OBE portion 22' that is an extension of the bottom electrode 22 that resides in the outside region 26. The portion of the outside piezoelectric portion 18' is removed to create the modified outside piezoelectric portion 18". The portion of the outside piezoelectric portion 18' is removed such that the entirety of the modified outside piezoelectric portion 18" resides on the OBE portion 22'. In other words, the OBE portion 22' extends into the outside region 26 past the modified outside piezoelectric portion 18". Specifically, the OBE portion 22' extends into the outside region 26 past a vertical plane that coincides with the outside point 46 of the modified outside piezoelectric portion 18".

The portion of the outside piezoelectric portion 18' and the portion of the OS layer 36 may be removed to create the modified outside stack portion 34B using any removal or trimming technique discussed above with reference to FIG. 6C. Accordingly, the method illustrated in FIG. 6D forms the modified outside stack portion 34B discussed above with reference to FIG. 5B.

With reference to FIG. 6E, the portion of the outside piezoelectric portion 18' is removed to create the modified outside piezoelectric portion 18" similar to the embodiment discussed above with reference to FIG. 6D. A portion of the OS layer 36 is also removed such that the modified outside piezoelectric portion 18" and the OS layer 36 both extend into the outside region 26 the same amount or lateral distance. In other words, both the modified outside piezoelectric portion 18" and the OS layer 36 extend to or end at a vertical plane that coincides with the outside point 46 of the modified outside piezoelectric portion 18"

The portion of the outside piezoelectric portion 18' and the portion of the OS layer 36 may be removed to create the modified outside stack portion 34C using any removal or trimming technique discussed above with reference to FIG. 6C. Accordingly, the method illustrated in FIG. 6E forms the modified outside stack portion 34C discussed above with reference to FIG. 5C.

Figure 6F:
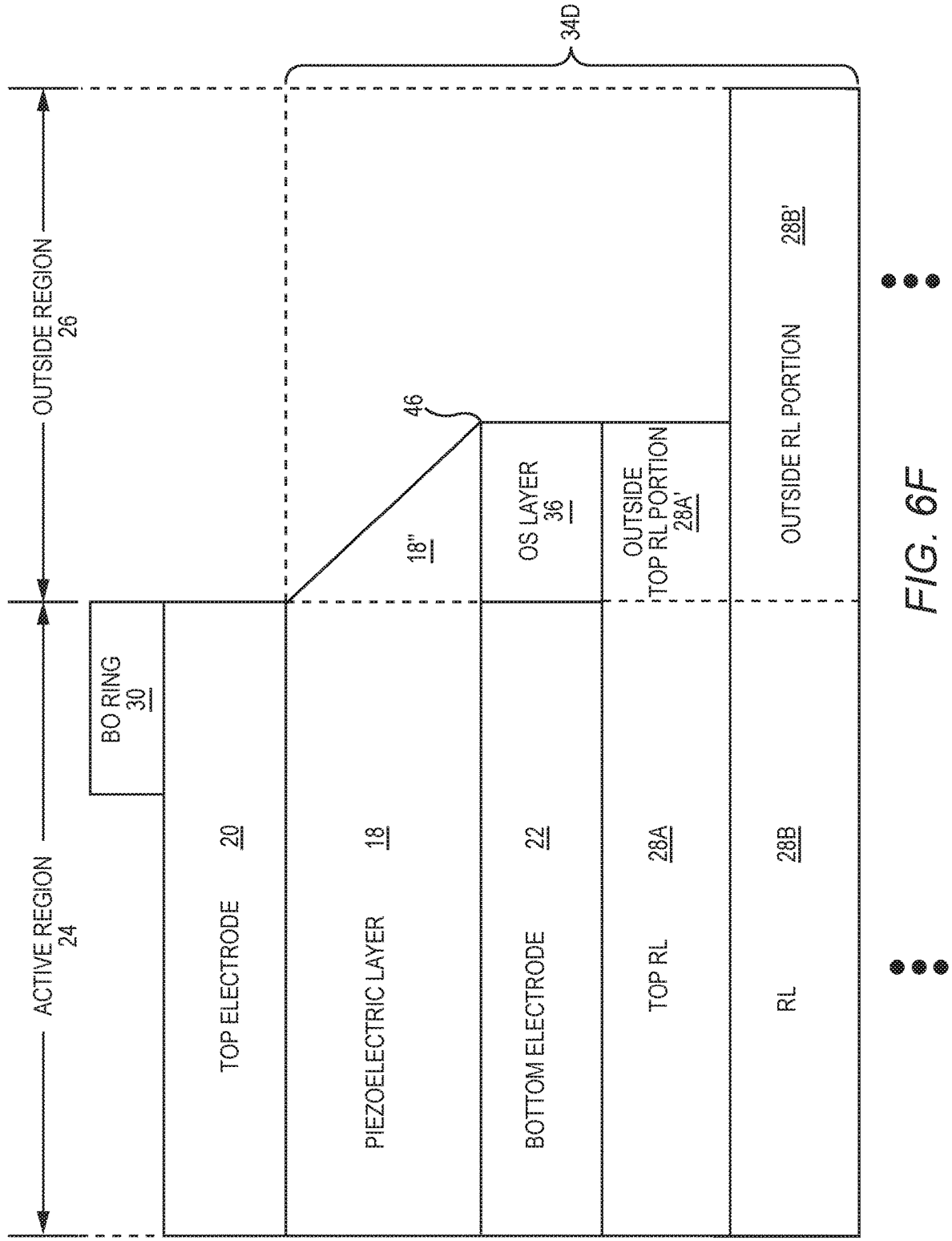

Referring to FIG. 6F, the portion of the outside piezoelectric portion 18' is removed to create the modified outside piezoelectric portion 18" and the portion of the OS layer 36 is removed similar to the embodiment discussed above with reference to FIG. 6E. A portion of the outside top RL portion 28A' is also removed such that the modified outside piezoelectric portion 18", the OS layer 36, and the outside top RL portion 28A' extend into the outside region 26 the same amount or lateral distance. In other words, each of the modified outside piezoelectric portion 18", the OS layer 36, and the outside top RL portion 28A' extend to or end at a vertical plane that coincides with the outside point 46 of the modified outside piezoelectric portion 18".

The portion of the outside piezoelectric portion 18', the portion of the OS layer 36, and the portion of the outside top RL portion 28A' may be removed to create the modified outside stack portion 34D using any removal or trimming technique discussed above with reference to FIG. 6C. Accordingly, the method illustrated in FIG. 6F forms the modified outside stack portion 34D discussed above with reference to FIG. 5D.

FIGS. 7A and 7B are diagrams illustrating phase curves representing the various degrees to which spurious modes are suppressed by a BAW resonator, such as BAW resonator 10, including the modified outside stack portions 34A-34D discussed above with reference to FIGS. 5A-5D, respectively. In the examples shown in FIGS. 7A and 7B, the acute angle ($\beta$) formed by the slope of the sidewall 48 is 80°, 70°, 60°, and 50°. In addition, FIGS. 7A and 7B show various heights and widths for the BO ring 30. In theory, an ideal phase curve that represents total energy confinement includes a smooth line with steep skirts and squared shoulders.

FIG. 7A illustrates three combinations when the acute angle ($\beta$) is 80°, 70°, 60°, and 50° and the height of the BO ring 30 is 40 nm. Specifically, a first combination has a height of 40 nm and a width of 3.25 µm for the BO ring 30, a second combination has a height of 40 nm and a width of 3.38 µm for the BO ring 30, and a third combination has a height of 40 nm and a width of 3.50 µm for the BO ring 30.

As illustrated in FIG. 7A, the phase curves closest to the ideal phase curve are produced by a BAW resonator that includes the modified outside stack portion 34B. Specifically, the lines in these phase curves are the smoothest, the skirts the steepest, and the shoulders are the most square when the acute angle ($\beta$) is 50°, 60°, and 70°.

The smooth lines, steep skirts, and squared shoulders in the phase curve are indications that the BAW resonator including the outside stack portion 34B is effectively suppressing spurious modes. Furthermore, fewer spurious modes are an indication that the BAW resonator including the modified outside stack portion 34B is efficiently confining the signal energy to the active region 24.

FIG. 7B illustrates three combinations when the acute angle ($\beta$) formed by the slope of the angled sidewall 48 is 80°, 70°, 60°, and 50° and the height of the BO ring 30 is 80 nm. Specifically, a first combination has a height of 80 nm and a width of 2.75 µm for the BO ring 30, a second combination has a height of 80 nm and a width of 2.28 µm for the BO ring 30, and a third combination has a height of 80 nm and a width of 3.0 µm for the BO ring 30.

As illustrated in FIG. 7B, the phase curve closest to the ideal phase curve is produced by a BAW resonator including the modified outside stack portion 34B. Specifically, the lines are the smoothest, the skirts the steepest, the shoulders are the most square when the acute angle ($\beta$) is 60°.

Again, the smooth lines, steep skirts, and square shoulders in the phase curve is an indication that the BAW resonator including the modified outside stack portion 34B is effectively suppressing spurious modes. Furthermore, fewer spurious modes are an indication that the BAW resonator including the modified outside stack portion 34B is efficiently confining the signal energy to the active region 24.

FIG. 8 is a diagram illustrating a comparison of the degree to which the spurious mode is suppressed by a BAW resonator including the modified outside stack portion 34B and the conventional BAW resonator 10. In FIG. 8, the acute angle (β) is 60°. Here, the BAW resonator including the modified outside stack portion 34B has three width combinations, 3.25 µm, 3.38 µm, and 3.50 µm, for a 40 nm height of the BO ring 30. The conventional BAW resonator 10 has three width combinations, 2.00 µm, 2.13 µm, and 2.25 µm, and a 60 nm height for the BO ring 30.

As illustrated in FIG. 8, the phase curve for the BAW resonator including the modified outside stack portion 34B includes significantly smoother lines, steeper skirts, and more square shoulders than the conventional BAW resonator 10. The phase curve for the BAW resonator including the modified outside stack portion 34B including smoother lines, steeper skirts, and more square shoulders than the conventional BAW resonator 10 is an indication that the structure of the modified outside stack portion 34B enables a BAW resonator to better confine lateral energy to the active region 24 and thus, suppress spurious modes better than the conventional BAW resonator 10.

Those skilled in the art will also recognize improvements and modifications to the preferred embodiments of the present disclosure. All such improvements and modifications are considered within the scope of the concepts disclosed herein and the claims that follow.

What is claimed is:

1. A Bulk Acoustic Wave (BAW) resonator, comprising:
a reflector;
a bottom electrode over the reflector;
a piezoelectric layer over the bottom electrode; and
a top electrode over the piezoelectric layer, wherein:
an active region is formed where the top electrode overlaps the bottom electrode,
an outside region surrounds the active region,
the piezoelectric layer includes a top surface adjacent to the top electrode and a bottom surface adjacent to the bottom electrode,
the piezoelectric layer comprises an outside piezoelectric portion in the outside region with a bottom surface in the outside region that is a horizontal extension of the bottom surface of the piezoelectric layer in the active region, and
the outside piezoelectric portion comprises an angled sidewall that resides in the outside region and extends from the top surface of the piezoelectric layer to the bottom surface of the outside piezoelectric portion in the outside region.

2. The BAW resonator of claim 1 wherein the angled sidewall forms an acute angle with respect to the bottom surface of the outside piezoelectric portion.

3. The BAW resonator of claim 1 wherein the angled sidewall begins at a point on the top surface of the piezoelectric layer at a boundary between the active region and the outside region.

4. The BAW resonator of claim 3 wherein the angled sidewall forms an acute angle with respect to the bottom surface of the outside piezoelectric portion.

5. The BAW resonator of claim 4 wherein the acute angle is between 45 degrees and 80 degrees.

6. The BAW resonator of claim 5 wherein the acute angle is between 60 degrees and 70 degrees.

7. The BAW resonator of claim 1 wherein:
the bottom electrode comprises an outside bottom electrode (OBE) portion that extends into the outside region;
the outside piezoelectric portion is formed on the OBE portion; and
the OBE portion extends into the outside region.

8. The BAW resonator of claim 7 wherein the OBE portion extends into the outside region past the outside piezoelectric portion.

9. The BAW resonator of claim 1 further comprising an outside (OS) layer in the outside region that is laterally adjacent to the bottom electrode, wherein the outside piezoelectric portion resides on the OS layer.

10. The BAW resonator of claim 9 wherein the OS layer extends into the outside region past the outside piezoelectric portion.

11. The BAW resonator of claim 9 wherein the OS layer and the outside piezoelectric portion extend a same lateral distance into the outside region.

12. The BAW resonator of claim 11 wherein:
a top layer of the reflector comprises an outside top reflector layer (RL) portion that resides in the outside region;
the OS layer resides on the outside top RL portion; and
the outside top RL portion and the OS layer extend the same lateral distance into the outside region.

13. The BAW resonator of claim 12 wherein the outside top RL portion and the OS layer comprise a same material.

14. The BAW resonator of claim 13 wherein:
a RL below the top layer of the reflector comprises an outside RL portion that resides below the outside top RL portion in the outside region; and
the outside RL portion comprises a different material than the outside top RL portion.

15. A method for fabricating a Bulk Acoustic Wave (BAW) resonator, comprising:
providing a reflector;
forming a bottom electrode over the reflector;
forming a piezoelectric layer over the bottom electrode; and
forming a top electrode over the piezoelectric layer, wherein:
an active region is formed where the top electrode and the bottom electrode overlap,
an outside region surrounds the active region,
the piezoelectric layer includes a top surface adjacent to the top electrode and a bottom surface adjacent to the bottom electrode, and
an outside piezoelectric portion of the piezoelectric layer with a bottom surface in the outside region that is a horizontal extension of the bottom surface of the piezoelectric layer is provided in the outside region in the active region; and
a portion of the outside piezoelectric portion is removed such that an angled sidewall resides in the outside region that extends from the top surface of the piezoelectric layer to the bottom surface of the outside piezoelectric portion in the outside region.

16. The method of claim 15 wherein the angled sidewall forms an acute angle with respect to the bottom surface of the outside piezoelectric portion.

17. The method of claim 15 wherein the angled sidewall begins at a point on the top surface of the piezoelectric layer at a boundary between the active region and the outside region.

18. The method of claim 15 wherein the portion of the outside piezoelectric portion is removed such that the angled sidewall forms an acute angle between 45 degrees and 80 degrees with respect to the bottom surface of the outside piezoelectric portion.

19. The method of claim 15 wherein the portion of the outside piezoelectric portion is removed such that the angled sidewall forms an acute angle between 60 degrees and 70 degrees with respect to the bottom surface of the outside piezoelectric portion.

20. The method of claim 15 wherein:
- an outside bottom electrode (OBE) portion that is an extension of the bottom electrode is provided in the outside region;
- the outside piezoelectric portion is provided on the OBE portion; and
- the portion of the outside piezoelectric portion is removed such that the OBE portion extends into the outside region.

21. The method of claim 20 wherein the OBE portion extends into the outside region past the outside piezoelectric portion.

22. The method of claim 15 further comprising forming an outside (OS) layer that is laterally adjacent to the bottom electrode in the outside region.

23. The method of claim 22 wherein the portion of the outside piezoelectric portion is removed such that the OS layer extends into the outside region past the outside piezoelectric portion.

24. The method of claim 22 wherein the portion of the outside piezoelectric portion is removed such that the OS layer extends a same lateral distance into the outside region as the outside piezoelectric portion.

25. The method of claim 24 wherein:
- an outside top reflector layer (RL) portion that resides in the outside region under the OS layer is provided; and
- a portion of the outside top RL portion is removed such that the outside top RL portion extends the same lateral distance into the outside region as the OS layer.

26. The method of claim 25 wherein the outside top RL portion and the OS layer comprise a same material.

27. The method of claim 26 wherein:
- a RL below the top layer of the reflector comprises an outside RL portion that resides below the outside top RL portion in the outside region; and
- the outside RL portion comprises a different material than the outside top RL portion.

* * * * *